United States Patent [19]

Chu et al.

[11] Patent Number: 6,001,687
[45] Date of Patent: Dec. 14, 1999

[54] PROCESS FOR FORMING SELF-ALIGNED SOURCE IN FLASH CELL USING SIN SPACER AS HARD MASK

[75] Inventors: Wen-Ting Chu, Kaoshung County; Di-Son Kuo, Hsinchu; Chrong-Jung Lin, Taipei; Hung-Der Su, Kao-Hsiung; Jong Chen, Taipei, all of Taiwan

[73] Assignee: Taiwan Semiconductor Manufacturing Company, Ltd., Hsin-Chu, Taiwan

[21] Appl. No.: 09/283,849

[22] Filed: Apr. 1, 1999

[51] Int. Cl.$^6$ .......................... H01L 21/28; H01L 21/8239
[52] U.S. Cl. ........................ 438/257; 438/296; 438/597; 438/682
[58] Field of Search ..................... 438/257, 264, 438/279, 296, 594, 597, 682, 683

[56] References Cited

U.S. PATENT DOCUMENTS

| 5,534,455 | 7/1996 | Liu | 438/263 |
|---|---|---|---|
| 5,552,331 | 9/1996 | Hsu et al. | 438/258 |
| 5,661,057 | 8/1997 | Fujiwara | 438/257 |
| 5,665,623 | 9/1997 | Liang et al. | 438/239 |
| 5,703,387 | 12/1997 | Hong | 257/315 |
| 5,736,442 | 4/1998 | Mori | 438/257 |
| 5,751,040 | 5/1998 | Chen et al. | 257/332 |
| 5,849,621 | 12/1998 | Gardner et al. | 438/279 |
| 5,874,328 | 2/1999 | Liu et al. | 438/199 |
| 5,923,992 | 7/1999 | Spikes et al. | 438/424 |

OTHER PUBLICATIONS

Watanabe, H., et al., "Novel 0.44$\mu$m$^2$ Ti–Salicide STI Cell Technology for High–Density NOR FLash Memories and High Performance Embedded Application", IEEE IEDM Tech. Digest, Dec. 1998, pp. 975–978.

*Primary Examiner*—T. N. Quach
*Attorney, Agent, or Firm*—George O. Saile; Stephen B. Ackerman

[57] ABSTRACT

When FLASH cells are made in association with STI (as opposed to LOCOS) it is often the case that stringers of silicon nitride are left behind after the spacers have been formed. This problem has been eliminated by requiring that the oxide in the STI trenches remain in place at the time that the silicon nitride spacers are formed. After that, the oxide is removed in the usual manner, following which a SALICIDE process is used to form a self aligned source line. When this sequence is followed no stringers are left behind on the walls of the trench, guaranteeing the absence of any open circuits or high resistance regions in the source line.

17 Claims, 4 Drawing Sheets

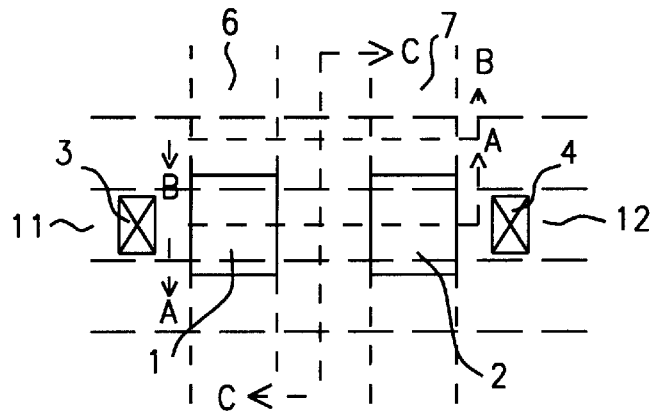
FIG. 1 - Prior Art
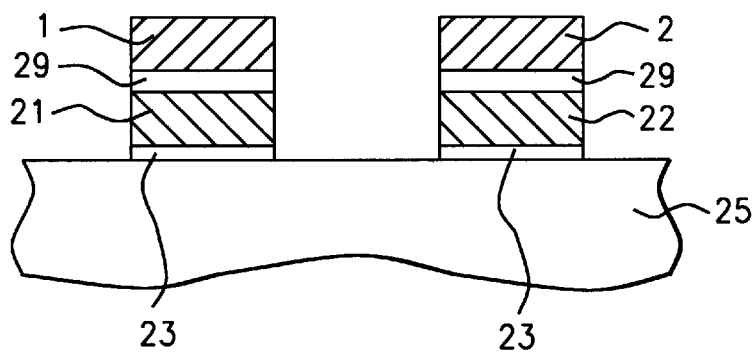
FIG. 2A - Prior Art
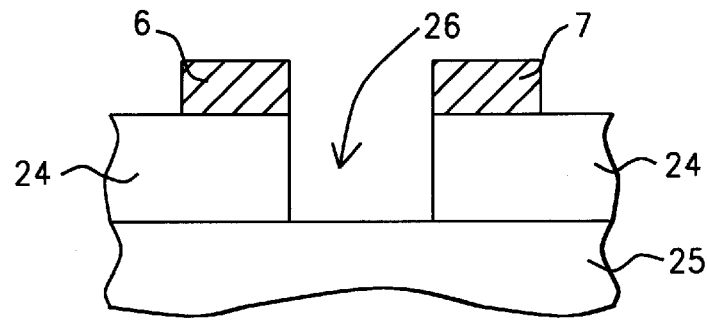
FIG. 2B - Prior Art
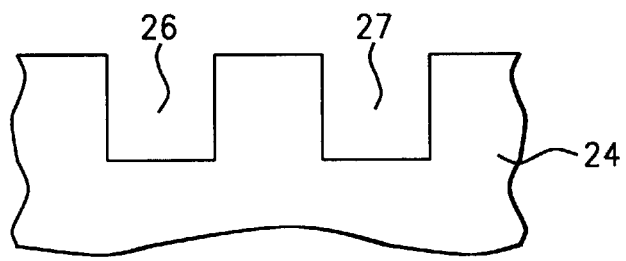
FIG. 2C - Prior Art

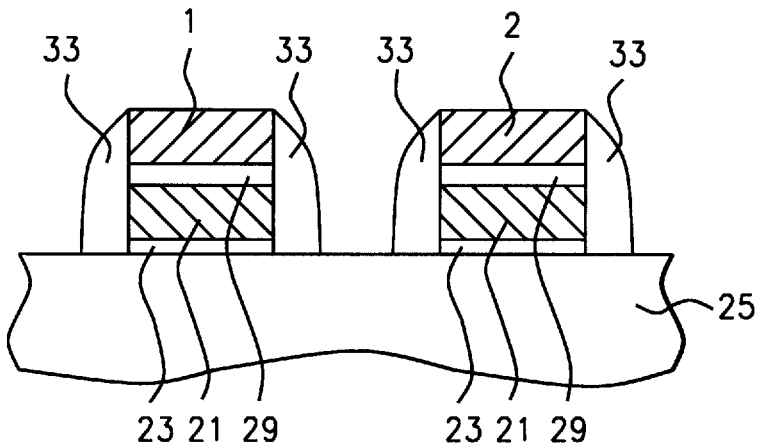
*FIG. 3A  -  Prior Art*
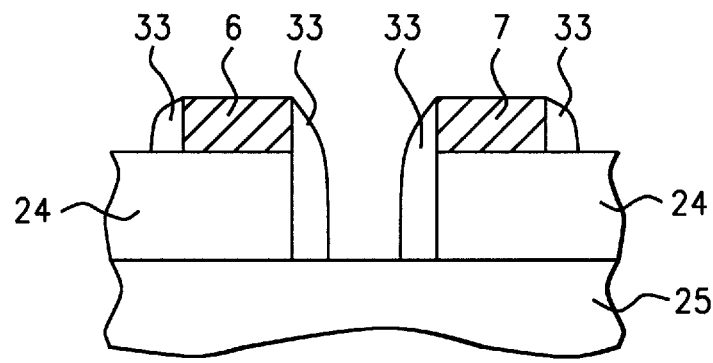
*FIG. 3B  -  Prior Art*
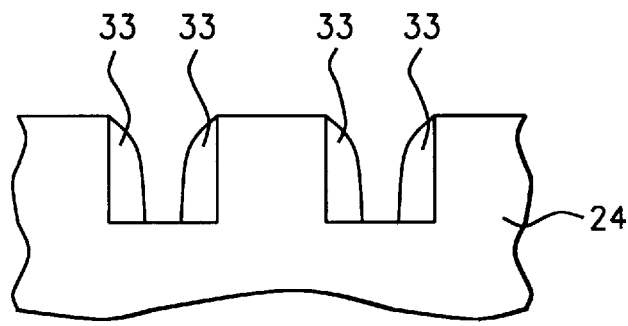
*FIG. 3C  -  Prior Art*

PROCESS FOR FORMING SELF-ALIGNED SOURCE IN FLASH CELL USING SIN SPACER AS HARD MASK

FIELD OF THE INVENTION

The invention relates to the general field of self-aligned contacts with particular reference to source contacts in FLASH cells.

BACKGROUND OF THE INVENTION

FLASH cells, such as the one shown in plan in FIG. 1, (comprise twin gates 1 and 2, each with its own drain line, 11 and 12 respectively, and a shared source line 5 that is located between them. In order to minimize cell size while at the same time avoiding short circuiting the source line to the edges of the gates, a self-alignment procedure has been routinely used for source line formation. This procedure is a version of the SALICIDE (self-aligned silicide) process). Spacers were grown on the vertical side walls of the gate pedestals, following which metal was deposited over the entire structure. This metal was selected for its ability to readily form a silicide with any silicon with which it was in contact while at the same time not reacting with the material of the spacers (typically silicon oxide or silicon nitride). Then, when all unreacted metal was selectively etched away, the metal silicide was left in place, separated from the gate pedestal by the spacers. For the metals in question (typically titanium, cobalt, and nickel) the suicides are sufficiently good conductors that they may then be contacted with metal at some point removed from the gates without introducing significant series resistance (see for example drain contacts 3 and 4 in the figure).

When FLASH cells were first introduced, dielectric isolation between devices was accomplished using the LOCOS (Local Oxidation of Silicon) process. As its name implies, LOCOS involves oxidizing the silicon surface (in the presence of masks) which results in an oxide-silicon interface that slopes inwards away from the surface giving it a shape commonly referred to as 'bird's beak'. In this situation, it was reasonable to etch the control gates before forming the self-aligned source line. As a result, oxide in the LOCOS regions between the gates was removed before the silicon nitride spacers were laid down causing the spacers to extend into them. This did not cause a problem because the LOCOS shape is not as sharp as an STI edge.

Because of its improved utilization of real estate on the chip surface, shallow trench isolation (STI) has been gradually replacing LOCOS. Seeing no reason to change other parts of the manufacturing process, workers in the field have continued to form the self-aligned source contacts according to the process described above. This is best illustrated by referring to FIGS. 2A, B, and C which are cross-sections taken through A—A, B—B, and C—C respectively in FIG. 1.

In FIG. 2A each gate is seen to be a compound structure of a control gate 1 or 2 (as seen in FIG. 1) and a floating gate 21 or 22. A conventional layer of gate oxide 23 is present between the floating gates and the surface of integrated circuit 25, while layer 29 of ONO (oxide, nitride, oxide) separates the floating gate from the control gate. The ONO acts as an isolation layer to separate the control gate from the floating gate.

In FIG. 2B, we see a cross-section made at a location somewhat removed from the main gate structure, showing that the control gate (or, more precisely, its extension in the form of the polysilicon word lines 6 and 7) rests on silicon oxide 24 which fills the STI trenches except for trench 26 from which the oxide has been removed in order to allow the still-to-be-formed source line to make contact with the silicon 25.

FIG. 2C is a cross-section taken through the space between the gates showing oxide free region 26 (as seen in FIG. 2B) as well as its counterpart 27 located on the other side of the inter-gate space.

FIGS. 3A–C show the structure after silicon nitride spacers 33 have been formed. While the spacers have their normal appearance in FIG. 3A, it can be seen that in FIGS. 3B and 3C the spacers extend beyond the control gates 6 and 7 down into the trenches. In the older LOCOS process, spacer material would be removed from the trench sidewalls as part of the spacer formation process itself, this removal occurring because the sidewalls were not vertical, but, in STI, the sidewalls are very nearly vertical so that the process can no longer distinguish between material on the sidewalls of the gates and material on the sidewalls of the trenches. The consequences of this are that when the next step in the process is executed (namely self-alignment through SALICIDE) the residual stringers of silicon nitride on the trench sidewalls interfere with formation of conductive silicide, leading to open circuiting in, or high resistance of, the source line (5 in FIG. 1). Another disadvantage of this process is that additional etching of the spacers in order to reduce their thickness (thereby increasing the width of the source line) is not desirable because an additional mask would be needed to protect other silicon nitride parts contained within the structure.

The present invention shows how the above problems may be avoided. We have performed a routine search of the prior art but did not find any patents that teach a solution similar to that of the present invention. Several references of interest were, however, encountered. For an example of forming self aligned contacts when LOCOS is used, see Liang et al. (U.S. Pat. No. 5,665,623). Hong (U.S. Pat. No. 5,703,387) uses shallow trench isolation but implements the self alignment portion of his process with oxide, spacers. Hsu et al. (U.S. Pat. No. 5,552,331) are concerned with a process involving several different device types and deal with this by using two different sets of spacers, formed to slightly different dimensions. Chen et al. (U.S. Pat. No. 5,751,040) best represent the STI based prior art that has been discussed above—they allow the spacers to form on the side walls of the trenches.

SUMMARY OF THE INVENTION

It has been an object of the present invention to provide a process for forming a self aligned source in a FLASH cell.

Another object of the invention has been to eliminate the possibility that silicon nitride stringers may be present during the SALICIDE process that is used to form the self aligned source.

A still further object of the invention has been to be able to maximize the width of the source line.

These objects have been achieved by requiring that the oxide in the STI trenches remain in place at the time that the silicon nitride spacers are formed. Once the latter are in place, the oxide is removed in the usual manner, following which a SALICIDE process is used to form a self aligned source line. When this sequence is followed, there is no possibility that silicon nitride stringers may be left behind on the walls of the trench, guaranteeing the absence of any open circuits or high resistance regions in the source line.

BRIEF DESCRIPTION OF THE DRAWINGS

FIG. 1 is a plan view of the structure formed through the process of the present invention.

FIGS. 2A–2C show cross sections taken through three different planes passing through FIG. 1 and represent the first of the two key steps of the prior art practice.

FIGS. 3A–3C show the same cross sections seen in FIG. 2 at a later stage in the process of the prior art.

DESCRIPTION OF THE PREFERRED EMBODIMENTS

To describe the process of the present invention, we will continue to refer to the plan view shown in FIG. 1 since no changes are introduced into its appearance.

The initial part of the invention follows standard process steps for forming the twin gate FLASH cell, the starting point being a partially formed integrated circuit that includes a layer of gate oxide 23 and two parallel, oxide filled, trenches as used for STI. These trenches typically have a width between about 0.2 and 1 microns and a depth between about 0.25 and 1 microns. Polysilicon layer 21/22 is then deposited to a thickness between about 0.3 and 3 microns. This is patterned and etched, using standard photolithographic techniques to form a pair of floating gates 21 and 22.

Next, a layer of ONO is deposited, to a thickness between about 100 and 300 Angstroms, followed by the deposition of polysilicon layer 12, to a thickness between about 0.1 and 0.5 microns. These layers are patterned and etched to form control gates 1 and 2 (over the floating gates) which extend outwards from them in a direction perpendicular to the trenches where they become word lines 6 and 7.

Figure 4A:
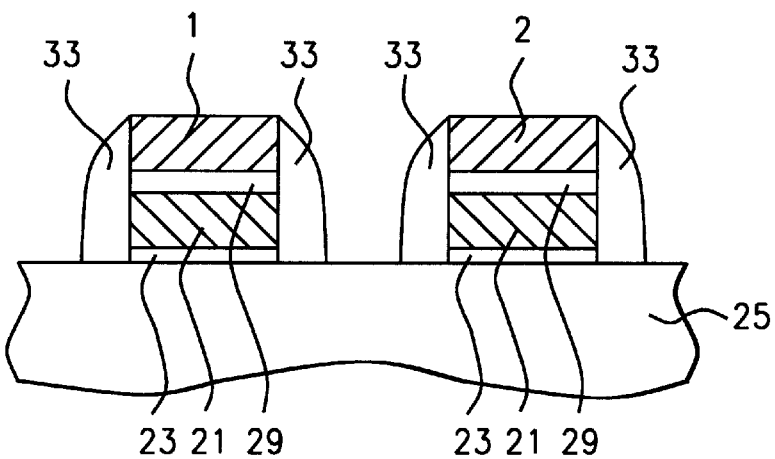
FIGS. 4A–4C show similar cross sections to FIGS. 2 and 3 except that oxide has been left in the shallow trenches.
Figure 4B:
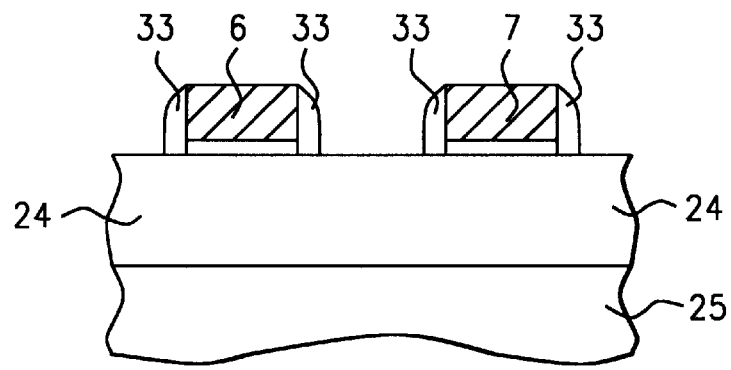
Figure 4C:
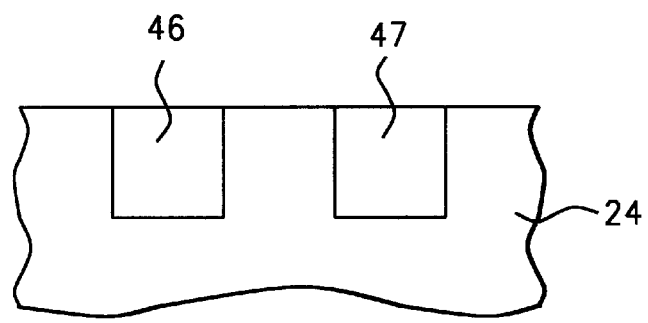

We refer now to FIGS. 4A–C. While FIGS. 3A and 4A are essentially the same, a comparison of FIG. 2B with FIG. 4B and FIG. 2C with FIG. 4C, reveals a major departure from the prior art, namely that oxide layer 24 has not been etched away, so that trenches 26 and 27 are still filled with oxide (shown as 46 and 47 in FIG. 4C). Silicon nitride spacers 33 are then formed on all vertical surfaces to an initial thickness that is between about 500 and 3,000 Angstroms.

Figure 5A:
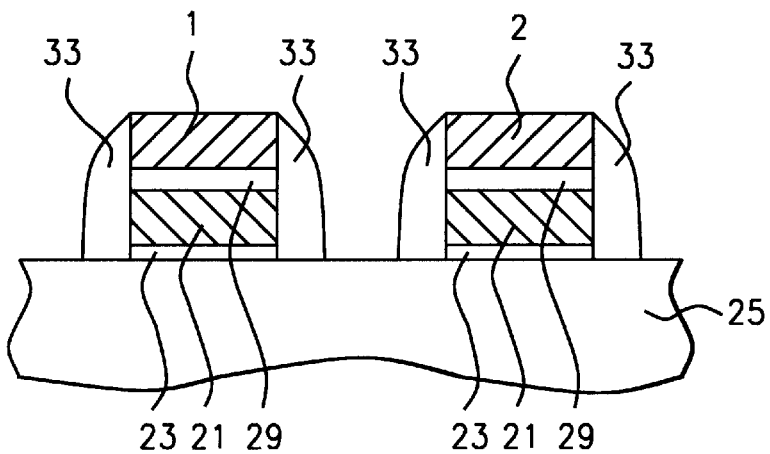
FIGS. 5A–5C show the structures of FIG. 4 after completing the process of the present invention.
Figure 5B:
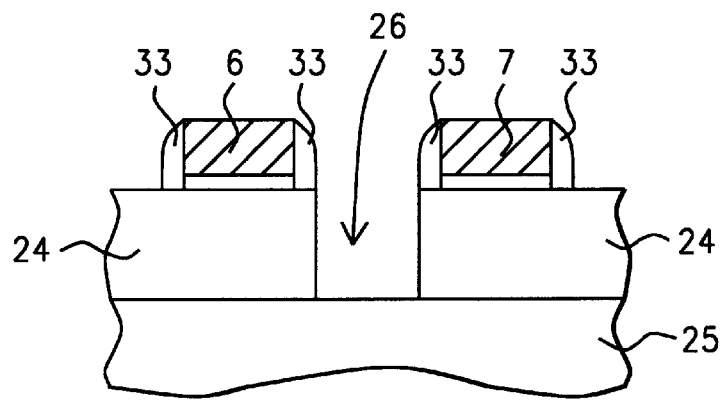
Figure 5C:
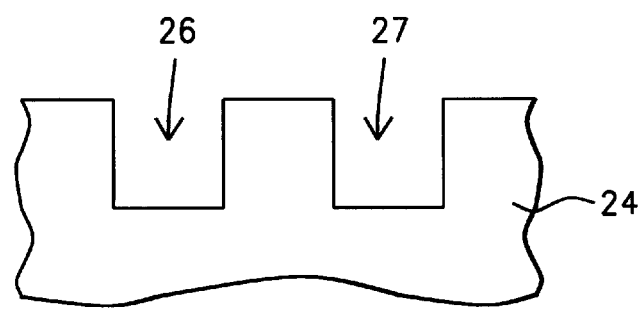

Moving on to FIGS. 5A–5C, all exposed oxide (not covered by the gates or the spacers) is then removed from inside the trenches. At this point, an optional second etch of the silicon nitride spacers may be performed whereby their final thickness is reduced to between about 500 and 3,000 Angstroms.

Next, a layer of a silicide forming metal such as titanium or cobalt (not shown) is deposited. The structure is then subjected to a rapid thermal anneal which causes the metal to react with the silicon, wherever it is in direct contact with it, to form its silicide. Any unreacted metal is then selectively etched away, resulting in the formation of a self-aligned source line between the floating gates.

This ends the process of the present invention. Because of the different sequence of the processing steps, relative to the prior art, no silicon nitride stringers have been left on the walls of the trenches so that no open circuits or high resistance regions are present in the source line. Another advantage is that, if the optional additional etching of the spacers was performed, a wider source line (for a given inter-gate separation) may be used (as wide as between about between about 0.1 and 1 microns for an inter-gate separation of between about 0.2 and 1.5 microns.

While the invention has been particularly shown and described with reference to the preferred embodiments thereof, it will be understood by those skilled in the art that various changes in form and details may be made without departing from the spirit and scope of the invention.

What is claimed is:

1. A process for forming a self-aligned source in a FLASH cell, comprising:

providing a partially formed integrated circuit, including a pair of floating gates, each on a layer of gate oxide, each having a side that is parallel to that of the other gate, and being separated from each other by a space;

providing a pair of oxide filled shallow trenches disposed on opposing sides of said space, running parallel to each other and at right angles to said sides;

providing a layer of ONO on said floating gates that extends beyond the floating gates and over the oxide filled trenches in a direction parallel to said sides;

providing a pair of control gates, on the ONO and over the floating gates; then executing the sequential steps of:
forming silicon nitride spacers on all vertical surfaces;
removing all exposed oxide from inside the trenches; and
forming a self-aligned source line, between the floating gates, by means of a SALICIDE process.

2. The process of claim 1 wherein the trenches have a width between about 0.2 and 1 microns.

3. The process of claim 1 wherein the trenches have a depth between about 0.25 and 1 microns.

4. The process of claim 1 wherein the layer of ONO has a thickness between about 100 and 300 Angstroms.

5. The process of claim 1 wherein the spacers have a thickness between about 500 and 3,000 Angstroms.

6. The process of claim 1 wherein the source line has a width between about 0.1 and 1 microns.

7. A process for forming a self-aligned source in a FLASH cell, comprising:

providing a partially formed integrated circuit, including a pair of floating gates, each on a layer of gate oxide, each having a side that is parallel to that of the other gate, and being separated from each other by a space;

providing a pair of oxide filled shallow trenches disposed on opposing sides of said space, running parallel to each other and at right angles to said sides;

providing a layer of ONO on said floating gates that extends beyond the floating gates and over the oxide filled trenches in a direction parallel to said sides;

providing a pair of control gates, on the ONO and over the floating gates; then executing the sequential steps of:
forming silicon nitride spacers on all vertical surfaces to a first thickness;
removing all exposed oxide from inside the trenches;
etching the silicon nitride spacers until they have been reduced to a second thickness; and forming a self-aligned source line, between the floating gates, by means of a SALICIDE process.

8. The process of claim 7 wherein the first thickness of the spacers is between about 500 and 3,000 Angstroms.

9. The process of claim 7 wherein the second thickness of the spacers is between about 500 and 3,000 Angstroms.

10. The process of claim 7 wherein the source line has a width between about 0.1 and 1 microns.

11. A process for forming a self-aligned source in a FLASH cell, comprising:

providing a partially formed integrated circuit including a layer of gate oxide and two parallel, oxide filled trenches, having a first space between them;

depositing a first layer of polysilicon;

patterning and etching said first polysilicon layer to form a pair of floating gates located within said first space, each having a side that is parallel to that of the other gate, and separated therefrom by a second space;

depositing a layer of ONO;

depositing a second polysilicon layer;

patterning and etching said second polysilicon and ONO layers to cover the floating gates and to extend outwards from them in a direction perpendicular to the trenches, thereby forming a pair of control gates over the floating gates as well as a pair of word lines; then executing the sequential steps of:

forming silicon nitride spacers on all vertical surfaces to a first thickness;

etching the silicon nitride spacers until they have been reduced to a second thickness;

removing all exposed oxide from inside the trenches;

depositing a layer of a silicide forming metal;

subjecting the integrated circuit to a thermal anneal and then selectively etching away any unreacted metal thereby forming a self-aligned source line between the floating gates.

12. The process of claim 11 wherein the first layer of polysilicon has a thickness between about 0.3 and 3 microns.

13. The process of claim 11 wherein the second layer of polysilicon has a thickness between about 0.1 and 0.5 microns.

14. The process of claim 11 wherein the first thickness of the spacers is between about 500 and 3,000 Angstroms.

15. The process of claim 11 wherein the second thickness of the spacers is between about 500 and 3,000 Angstroms.

16. The process of claim 11 wherein the source line has a width between about 0.1 and 1 microns.

17. The process of claim 11 wherein said silicide forming metal is titanium or cobalt or nickel.

* * * * *